United States Patent [19]
Hwang et al.

[11] Patent Number: 6,049,219
[45] Date of Patent: Apr. 11, 2000

[54] SIGNAL PROBING OF MICROWAVE INTEGRATED CIRCUIT INTERNAL NODES

[75] Inventors: James C. Hwang, Bethlehem, Pa.; Ce-Jun Wei, Burlington, Mass.; Lois T. Kehias; Mark C. Calcatera, both of Dayton, Ohio

[73] Assignee: The United States of America as represented by the Secretary of the Air Force, Washington, D.C.

[21] Appl. No.: 08/855,780

[22] Filed: May 12, 1997

Related U.S. Application Data

[60] Provisional application No. 60/017,315, May 13, 1996.

[51] Int. Cl.$^7$ .................................................. G01R 1/04
[52] U.S. Cl. ........................................ 324/765; 324/158.1
[58] Field of Search ................................ 324/158.1, 601, 324/637, 632, 639, 645, 642, 765; 333/247, 248

[56] References Cited

U.S. PATENT DOCUMENTS 4,980,636  12/1990  Romannofsky et al. ................ 324/601
5,268,636  12/1993  Phillips et al. ......................... 324/158.1

OTHER PUBLICATIONS

C. J. Wei, Y. A. Tkachenko, J. C. M. Hwang, K. R. Smith and A. H. Peak, "Internal–Node Waveform Analysis of MMIC Power Amplifiers", IEEE Trans. Microwave Theory Tech., vol. 43, No. 12, Dec. 1995.

C. J. Wei, Y. A. Tkachenko, J. C. M. Hwang, K. R. Smith and A. H. Peak, "Internal–Node Waveform Probing of MMIC Power Amplifiers", abstract document presented to attendees at IEEE Microwave and Millimeter–Wave Monolithic Circuits Symposium May 14, 1995.

"Fine–Pirch Microprobes", manufacturer's data sheet published by Cascade Microtech Inc., Mar. 1993.

C. J. Wei, Y.A. Tkachenko and J.C.M. Hwang, "Non–Invasive Waveform Probing for Non–Linear Networks Analysis," 1993 IEEE MTT–S Digest , pp. 1347–1350 (month available).

Y.A. Tkachenko, Y. Lan, D.S. Whitefield, C.J. Wei and J.C.M. Hwang et al. "Hot Electron–Induced Degradation of Metal–Semiconductor Field–Effect Transistors," GaAs IC Symposium, 1994 IEEE, pp. 259–262, (month unavailable).

F. Van Raay and G. Kompa, "A New On–Wafer Large–Signal Waveform Measurement System with 40 Ghz Harmonic Bandwidth," 1992 IEEE MTT–S Digest, pp. 1435–1438 (month unavailable).

M. Demmler, P.J. Tasker, M. Schlechtweg, "A Vector Corrected High Power On–Wafer Measurement System with a Frequency Range for the Higher Harmonics up to 40 Ghz", European Microwave Conf. 1994, pp. 1367–1372 (month unavailable).

*Primary Examiner*—Vinh P. Nguyen
*Attorney, Agent, or Firm*—Gerald B. Hollins; Thomas L. Kundert

[57] ABSTRACT

A microwave integrated circuit internal-node waveform probing arrangement using a portable ungrounded voltage sensing probe and a commercially available transition analyzer instrument are disclosed. Harmonic frequency and phase processing are accomplished on the probe sensed voltage waveforms from internal nodes of for example a C-band monolithic microwave integrated circuit (MMIC) power amplifier circuit device. The disclosed probing is applied to determining signal voltage and signal current flow waveforms for the MMIC device. Examples relating to use of the invention to analyze operation of microwave circuits and prevent premature device failures are included; these include variation of waveforms as a function of frequency, drive and measurement location in a device. The potential impact of the disclosed technique includes MMIC design verification, in-situ device model extraction, process diagnosis, and reliability assessment.

14 Claims, 12 Drawing Sheets

SIGNAL PROBING OF MICROWAVE INTEGRATED CIRCUIT INTERNAL NODES

CROSS REFERENCE TO RELATED PATENT DOCUMENT

This application claims the benefit of U.S. Provisional Application Ser. No. 60/017,315 filed May 13, 1996.

RIGHTS OF THE GOVERNMENT

The invention described herein may be manufactured and used by or for the Government of the United States for all governmental purposes without the payment of any royalty.

BACKGROUND OF THE INVENTION

This invention concerns the field of electrical measurements (including the measurement of electrical current flow) accomplished with minimal measured circuit interruption within the small confines of an operational electronic integrated circuit die and with the measured signals being of microwave or millimeter wave or the like electrical frequency.

In the design, fabrication, use and analysis of integrated circuit devices and other electrical assemblies, there often arises a need for quantitative and accurate assessment of the electrical operating conditions imposed on specific elements comprising the complete circuit assembly. Such quantitative information can be of assistance in assuring long operating life of each element in the circuit assembly, in understanding reasons if this life is not achieved and in optimizing such characteristics as element physical size, element attained operating temperature and signal path intercoupling tendencies, for examples.

As a specific example of using the present invention measurement concepts, it is found to be desirable when analyzing monolithic microwave integrated circuits (MMICs) or millimeter wave integrated circuit devices to obtain signal information relevant to actual signal nodes existing within the device—to obtain realistic values for the drain voltage and drain current experienced by a particular transistor of the parallel-connected transistors in a heterojunction field-effect transistor amplifier for example. Often such accurate measurements of transistor drain or gate signal levels will identify a failure-inducing condition, however, such measurements at nodes located within an MMIC device have not heretofore been available.

Notably, for example, the measurements disclosed in the technical paper "Non-Invasive Waveform Probing for Nonlinear Network Analysis," by C. J. Wei, Y. A. Tkachenko and J. C. M. Hwang, which appears in the *IEEE MTT-S Int'l Microwave Symp. Dig.*, May 1993, pp. 1347–1350 have certain similarity to those of the present invention with the significant exception that the measurements of this paper are all accomplished external to the device under test. It is also notable that although this paper discloses, at page 1349, column 1, line 3–4, the use of a non grounded high impedance test probe, several ramifications of such a non grounded probe to the device under test may not have been appreciated and disclosed in this paper.

When the needed integrated circuit information resides in direct current and low frequency electrical signals it is usually possible to perform quantitative measurements even within an integrated circuit die using well-known conventional electrical measurement tools. When the needed measurement involves signals of microwave or millimeter wave or the like electrical frequency, however, the performance of even certain fundamental measurements at nodes of an integrated circuit device is accomplished only with difficulty or is impossible of practical accomplishment because of the technical complexities involved. In many instances the measurement of electrical signal current flow has come within this latter difficult or impossible category.

Non-invasive, internal-node waveform probing is a technique which therefore can be of assistance in measurement and diagnosis of integrated circuits under real operating conditions, however this technique has heretofore been useful primarily in circuits which operate at a frequency below one gigahertz. This non-invasive, internal-node waveform probing has heretofore not extended to MMICs and similar circuits often because of the tendency for the probe employed to perturb the MMIC operation so greatly as to make the measured results of little value. Moreover the often used sampling oscilloscope generates only time-domain information, which makes correction for instrument dispersion by standard frequency-domain calibration techniques difficult. The typical microwave measurement probe also presents a major disturbance or leakage path to a signal node under test, e.g., to a transmission line under test, because both the probe and the transmission line have characteristic impedances near fifty ohms.

SUMMARY OF THE INVENTION

The present invention provides for low disruption test probe measurement of microwave and millimeter wave electrical voltages and current flows within an integrated circuit device.

It is an object of the present invention therefore to provide an electrical signal measurement arrangement usable at frequencies in the microwave and millimeter wave spectral ranges.

It is another object of the invention to provide an MMIC internal node electrical signal measurement arrangement which causes little or no disturbance in an electrical circuit operating at frequencies in the microwave and millimeter wave spectral ranges.

It is another object of the invention to provide an MMIC internal node electrical signal measurement arrangement which does not require the use of local grounding of the signal collecting test probe.

It is another object of the invention to provide an MMIC internal node electrical signal measurement arrangement which accommodates an absence of the signal collecting test probe local grounding by either of two alternate procedures.

Additional objects and features of the invention will be understood from the following description and claims and the accompanying drawings.

These and other objects of the invention are achieved by the operation perturbance-limited method of waveform-analyzing signals of microwave and millimeter wave frequency at circuit nodes internal to an operating integrated circuit electronic device, said method comprising the steps of:

selecting physical and electrical characteristics of an input-ungrounded, high impedance, signal-attenuating, resistive input portable test probe and a transmission line member connected thereto to provide a combined probe and transmission line resonance frequency below a waveform analyzing frequency selected for said operating integrated circuit electronic device;

communicating, via said input-ungrounded, high impedance, signal-attenuating, resistive input portable test probe, voltage signals from a first selected internal signal node of said operating microwave and millimeter wave frequency integrated circuit electronic device to a transition analysis electronic circuit apparatus;

excluding from said communicated microwave and millimeter wave frequency signals resonance peak effects attributable to said input-ungrounded, high impedance, signal-attenuating, resistive input portable test probe and transmission line member connected thereto;

said resonance peak effects-excluded communicated microwave and millimeter wave frequency signals being identified as first processed signals;

determining, by harmonic sampling of said first processed signals within said transition analysis electronic circuit apparatus, a fundamental frequency through Nth harmonic frequency-related array of voltage magnitude and phase data, data characteristic of said operating integrated circuit selected internal signal node voltage signals;

constructing, from said array of fundamental frequency through Nth harmonic frequency-related magnitude and phase data, a time domain representation of a waveform characteristic of said selected signal node voltage signals.

DETAILED DESCRIPTION

Figure 1:
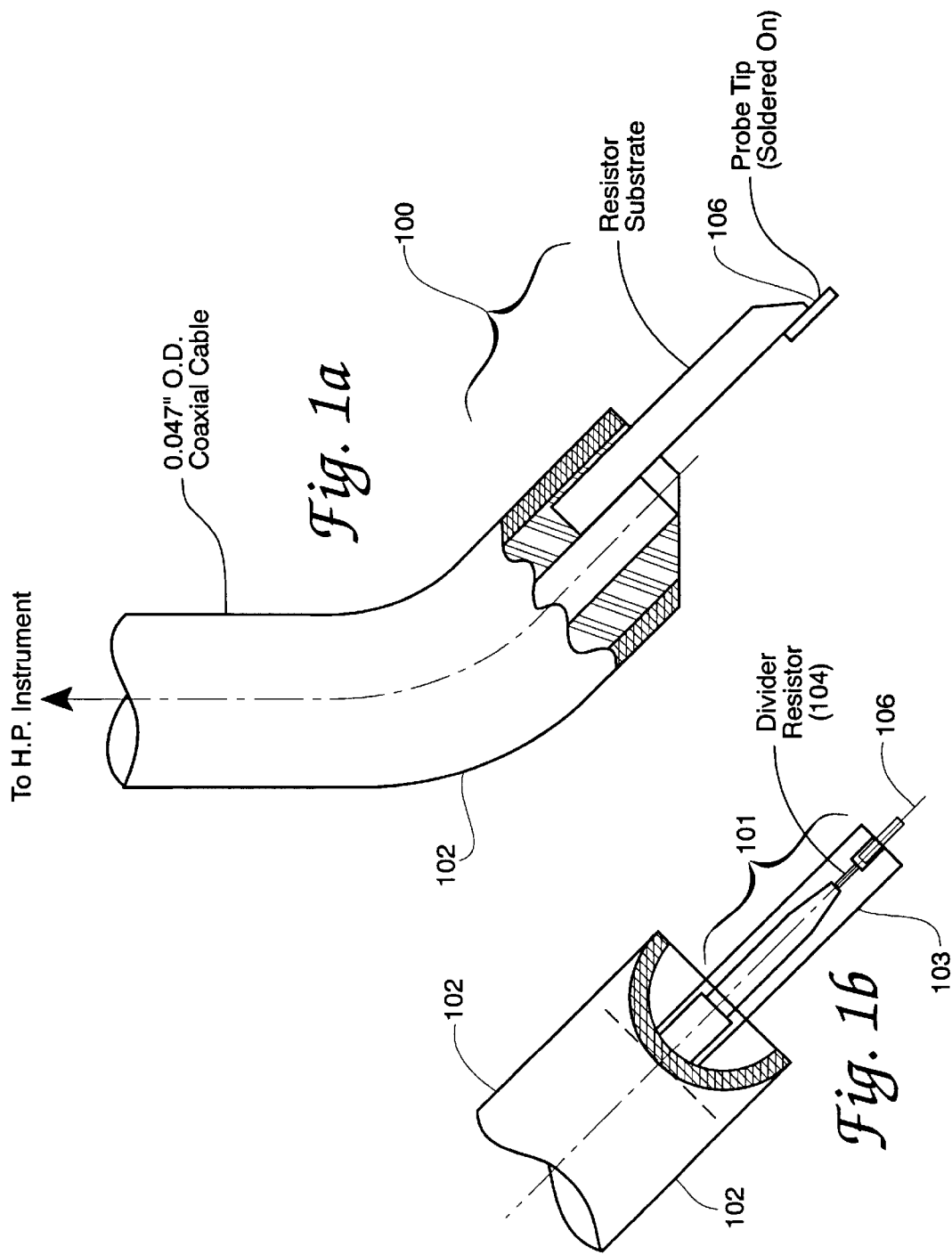
FIG. 1a shows a side view of a high impedance microwave electrical signal probe usable to collect signal data in the present invention.
FIG. 1b shows a bottom view of the FIG. 1a signal probe.

The microwave transition analyzer instrument available from Hewlett-Packard Company, (HP) of Palo Alto, Calif., is capable of generating signal-descriptive information in both the time domain and frequency domain. This instrument which is variously identified as a part of the HP modular microwave family of test instruments, as a part of the HP 71500 series of instruments and as the HP model 70820A microwave transition analyzer instrument is technically described and provided with utilization information in a multi volume set of manuals which are supplied by HP with the instrument, manuals which comprise information in the public domain. This microwave transition analyzer instrument provides a harmonic sampling capability to measure both the magnitude and phase of the harmonic components comprising an input signal of microwave frequency. Harmonic component output data from the instrument is available in both data array and displayed waveform formats. Knowing the amplitude, frequency and phase characteristics of the harmonic components of an input signal allows reconstruction of the voltage time domain waveform of this input signal, a task which can be accomplished using a fast Fourier transform algorithm also included in the microwave transition analyzer instrument. With such reconstructed knowledge of the voltage waveforms at two different locations along a transmission line, for example, the waveform of the transmission line current can additionally be determined.

A high-impedance test probe recently made available by Cascade Microtech, Incorporated of Beaverton, Oreg., 97005, adds to the utility of the HP microwave transition analyzer instrument in certain uses involving measurements performed at internal elements of an integrated circuit, such as a MMIC circuit device. This test probe, known as the type FPM probe (fine pitch module), includes a physically small input node arrangement and is characterized to provide bandwidth characteristics of 18 gigahertz in its 10×, 20× and 100× higher attenuation embodiments. When properly characterized and terminated this probe is found to be capable of use at even higher microwave and millimeter wave frequencies.

The extended frequency capability of this portable test probe is believed to occur in part because of the physical configuration of the probe's input tip structure, including the size and elongated shape of its series input resistor. Use of an extended length, etched pattern fabrication and an alumina substrate for implementing this input resistor 104, as shown at 100 and 101 in the FIG. 1 drawing, is believed to contribute significantly to the low capacitance loading and usable microwave and millimeter wave performance of this probe. The presently preferred probe has a soldered-on single tip, 106 in FIG. 1, of 40 micrometers diameter. This diameter is ideal for probing for example 50 ohm microstrip transmission line conductors located on 100 micrometers thick GaAs layers in an MMIC. If necessary, the probe tip can be made smaller but it will then not be as physically rugged.

Essential element details of a voltage probe of the Cascade Microtech Incorporated type are shown in the FIG. 1a side view and FIG. 1b bottom views of the FIG. 1 drawing herein. As illustrated in these FIG. 1 views, this high-impedance probe 100 includes the series connected input resistor 104, of preferably some 450 ohms resistance value, located adjacent the probe tip 106 with both the probe tip and the resistor 104 being supported on an insulating substrate member 103 which may be made of a high frequency-compatible insulating material such as refractory alumina. This probe tip and resistor combination is followed by a standard broad-band (equal to or greater than 40 gigahertz) 50 ohm coaxial cable transmission line 102 which in the present usage couples to an impedance matched input port of the microwave transition analyzer instrument. The series resistor 104 at the probe tip end 106 acts as a potential divider to attenuate a probe-contacted input signal, by a factor of ten for example, in the case of a 500 ohm probe used with a 50 ohm coaxial cable transmission line. When using the microwave transition analyzer instrument such signal attenuation is usually not of concern because the input port of the instrument has an amplitude dynamic range greater than 60 dB. It is also significant that the relatively high impedance presented by the FIG. 1 probe to, for example, a transmission line under test, causes little perturbance to the operation of a MMIC device which incorporates this transmission line, i.e., to the device under test, as is illustrated and discussed in connection with FIG. 3 subsequently herein. If necessary, higher impedance (e.g., 1,000 ohm) probes can be used to decrease the tested circuit perturbance at the expense of increased attenuation.

The FIG. 1 probe is preferably operated in a perhaps unusual combination of electrical environment conditions in the present invention. A first of these conditions attends the impedance matching terminations imposed on the probe's coaxial cable element 102. At the transition analyzer instrument end of this coaxial transmission line the transition analyzer instrument itself provides a carefully tailored correct termination impedance (generally of 50 ohms impedance level) and thereby prevents signal reflections from this transmission line terminal point from returning along the transmission line to confuse or complicate the data received from the probed integrated circuit node—or from affecting operation of the integrated circuit device itself. (This termination aspect of the present measurement invention is in fact one area in which it is improved over measurement arrangements accomplished with a sampling oscilloscope since the probe input to the amplifiers of such equipment are often allowed to be un-terminated or terminated in a high impedance mismatch condition for gain increasing reasons.)

At the sending end or probe end of the coaxial transmission line 102 the probe element geometry is selected to comprise the desired 50 ohm characteristic impedance, however, the resistive termination is not of this characteristic impedance level and is instead in the nature of 450 ohms— assuming the probe tip 106 is in contact with an integrated circuit signal node of zero ohms impedance. Since the signals arriving at the microwave transition analyzer instrument are not reflected from a proper termination of the line 102 (along the path 206 in FIG. 2) at the instrument 202 end and also since no signals originate at the microwave transition analyzer instrument end of this transmission line, undesired signal reflections do not occur from the probe end impedance-mismatched termination of the transmission line 102. A reflection-free transmission of test probe signals is therefore possible. These arrangements also provide a desired broadband transmission of signals to the data input port of the microwave transition analyzer instrument 202, a transmission capability compatible with the 40 gigahertz bandwidth of the microwave transition analyzer instrument's two signal input ports of paths 206 and 208. (The microwave signal received via the path 208 from the tested MMIC 220 output port is used as the phase reference for the microwave transition analyzer instrument output data.)

Another of the present invention unusual termination conditions attends the fact that the FIG. 1 probe is preferably operated without grounding to the integrated circuit device under test. In fact the grounding lead provided with the FIG. 1 probe by the Cascade Microtech Incorporated manufacturer is preferably removed from the probe for use in the present invention. This non grounded probe arrangement is of course a major convenience in accomplishing portable probe capture of signals from within an integrated circuit device, since it avoids the need for special grounding pad placements in the integrated circuit device's layout—i.e. the large space-consuming pads as would be necessary if the probe had adjacent fixed in position signal input and grounding tips for example. Need for the short tether or pigtail grounding of an input probe (which is doubtless ineffective at the microwave and millimeter wave frequencies under consideration) is also avoided by this non grounded probe arrangement. Those familiar with electrical measurements will perhaps be somewhat surprised by this ungrounded probe arrangement since it is totally contrary to most electrical signal sampling and measurement practices. Clearly for example one does not attempt to perform oscilloscope waveform examinations in the audio and digital signal spectrum segments without some consideration of a probe grounding arrangement. As explained in portions of this specification appearing below however such non grounding is fully successful in the present invention with the use of certain accommodations.

Figure 2:
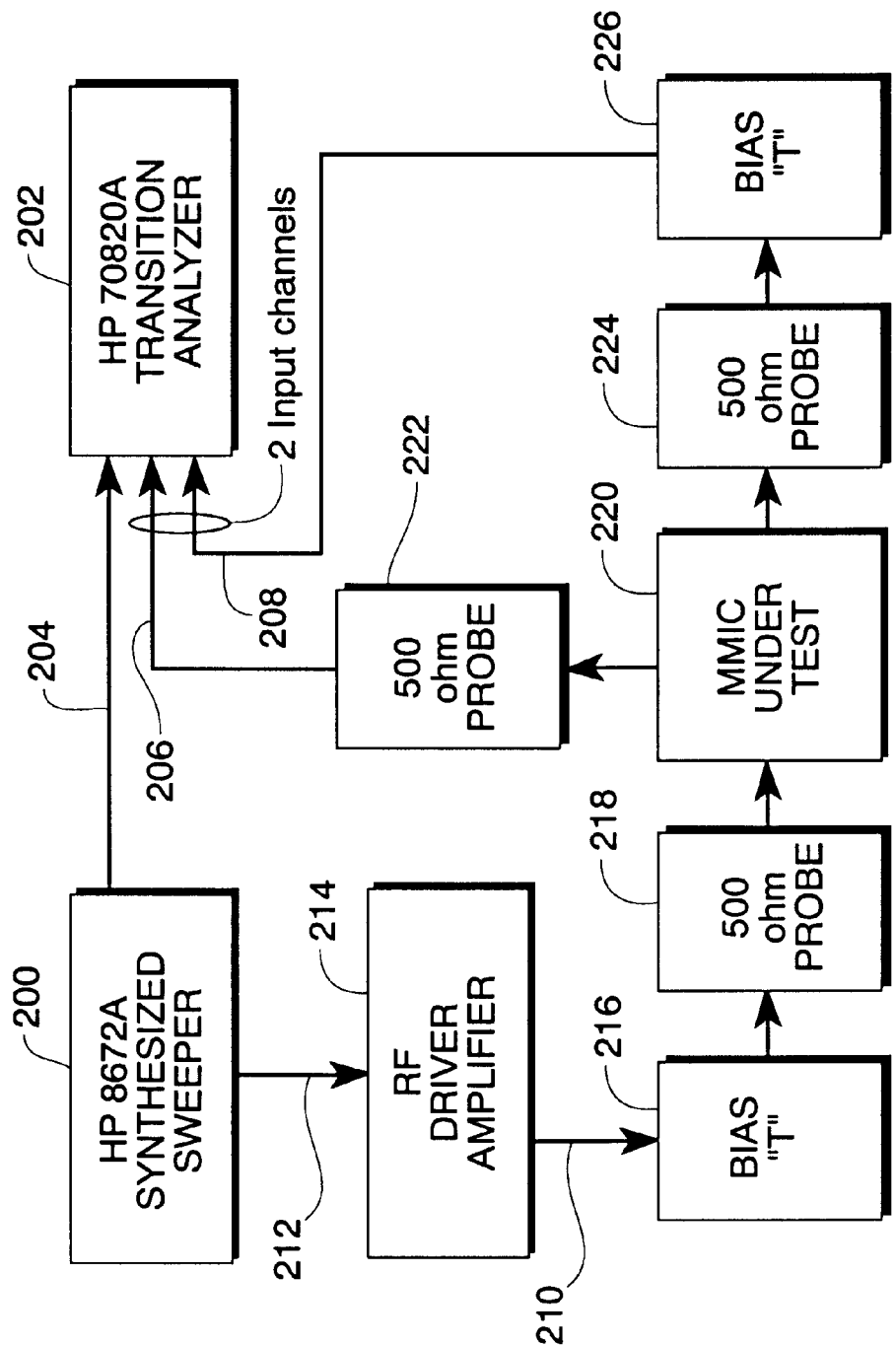
FIG. 2 shows a microwave signal measurement setup according to the present invention in block diagram form.

In order to provide detailed disclosure of the present invention and concurrently develop quantitative data evidencing its harmony with underlying theoretical concepts, the FIG. 1 probe and the microwave transition analyzer instrument may be used as shown in FIG. 2 of the drawings to measure voltage and current waveforms as a function of input frequency and input power level at various locations in, for example, a group of similar C-band MMIC power amplifier circuit devices. These measurements may be made without any MMIC layout modification or test structures such as local grounding pads or high impedance test circuits on chip. The error of the accomplished measurements and the perturbance their accomplishment causes to MMIC operation may be estimated—and verified from certain parts of the measured data, to be less than ±10%.

The thusly disclosed invention is a further refinement of concepts disclosed in the above described technical paper "Non-Invasive Waveform Probing for Nonlinear Network Analysis," by C. J. Wei, Y. A. Tkachenko and J. C. M. Hwang, which appears in the *IEEE MTT-S Int'l Microwave Symp. Dig.*, May 1993, pp. 1347–1350 and is particularly improved with respect to the measurement set up and calibration procedure used. The measured data presented herein particularly demonstrates the non-invasiveness, self-consistency, and reproducibility of the disclosed measurement technique. Imbalance in signal distribution among the MMIC amplifier unit cells is quantified in certain of the disclosed data and its cause discussed. Load impedance and voltage stress as experienced by a transistor inside a MMIC is determined from waveforms measured under both normal and overdriven conditions. Waveform-based MMIC device model extraction and verification may additionally be accomplished from the measured data however these steps are not pursued in detail herein.

The preferred measurement arrangement is therefore illustrated in FIG. 2 of the drawings. In this FIG. 2 the above described 500 ohm test probe 222 is a central part of the measurement arrangement and is used to supply MMIC circuit node voltage signals via the coaxial cable path 206 to the microwave transition analyzer instrument 202. Signals for driving the MMIC under test, 220, are provided by the sweeping signal generator 200 via a coaxial cable path 212, the driving amplifier 214, the coaxial cable path 210, the bias tee radio frequency signal to bias energy source isolating network 216, and a 50 ohm impedance coupling probe 218. As indicated previously herein the test probe 222 in the FIG. 2 apparatus does not require a ground contact to the MMIC device-under-test 220, especially when embodied as the Cascade Microtech FPM probe. Additional details of this desirable non grounded arrangement are discussed later herein. The absence of a grounding requirement allows convenient probe placement anywhere on a tested MMIC. The preferred Cascade Microtech FPM probe also has notable bandwidth capability, allowing up to the fifth harmonic of a 5 GHz signal to be reliably measured.

Continuing with the FIG. 2 drawing, normal output port signals of the MMIC under test are supplied to the microwave transition analyzer instrument 202 along the coaxial cable path 208 by way of a second 50 ohm impedance coupling probe 224 and a second bias tee radio frequency signal to bias energy source isolating network 226. Typically, the phases of all the harmonics are referenced to the MMIC amplifier output, which is simultaneously measured using the second input channel of the transition analyzer and the path 208; it is also possible however to use the device-under-test input signal of path 210 as the phase reference. A reference signal replica of the signal generator 200 output signal of path 212 is also supplied along the coaxial cable path 204 to the microwave transition analyzer instrument 202. Additional details of the signal requirements, the operating theory, and other aspects of the microwave transition analyzer instrument 202 are available from the HP technical manuals referred-to above. The bias tee networks 216 and 226 in the FIG. 2 test arrangement are used to supply direct current biases of for example negative two and positive nine volts to the gate and drain circuits of the MMIC under test, 220, from external bias sources which are not shown in FIG. 2. These bias tee networks provide the needed isolation of direct current and radio frequency paths to the MMIC in a manner which is known in the art. Such networks are available in a variety of previously fabricated configurations from several suppliers to the electronic arts.

The 50 ohm probe elements indicated at 218 and 224 in the FIG. 2 drawing provide desired 50 ohm broadband coupling of signals into and out of the MMIC device-under-test 220. These elements 218 and 224 are preferably embodied in the form of coplanar transmission line-inclusive networks and serve as a smaller and more practical substitute for the coaxial test fixtures often used in such locations, such test fixtures have however also been used with the invention. The RF driver amplifier 214 serves to increase the power level of the microwave or millimeter wave signals received from the signal generator 200 to the power level needed for full operation of the MMIC device-under-test 220. The signal generator 200 is indicated to be of a HP type 8672A sweep generator type. The sweeping capability of this generator may be used to accomplish broadband testing of MMIC and other devices to search for points of resonance for example. For the present harmonic based probe testing however this generator is operated in a fixed frequency or stepped frequency mode in which the harmonic components for each applied frequency can be readily considered. The path 204 signal from the signal generator 200 to the microwave transition analyzer instrument 202 provides for synchronized operation of the microwave transition analyzer instrument.

Figure 3A:
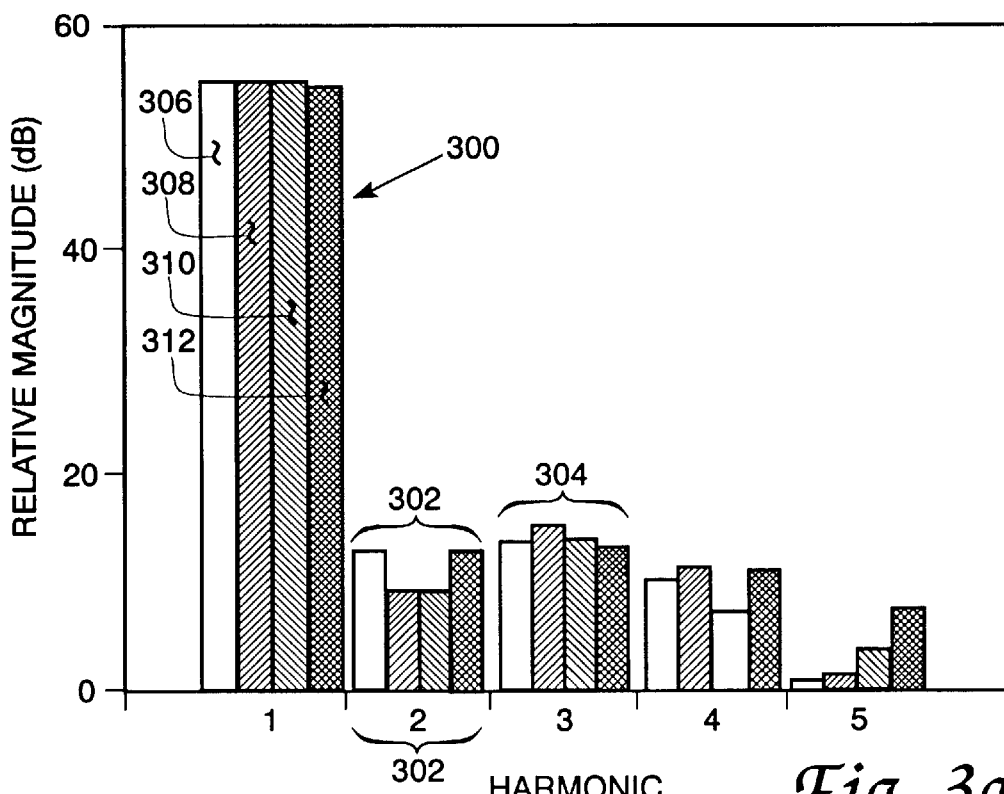
FIG. 3a shows signal amplitude measurements indicating the non invasive characteristics of the present invention.
Figure 3B:
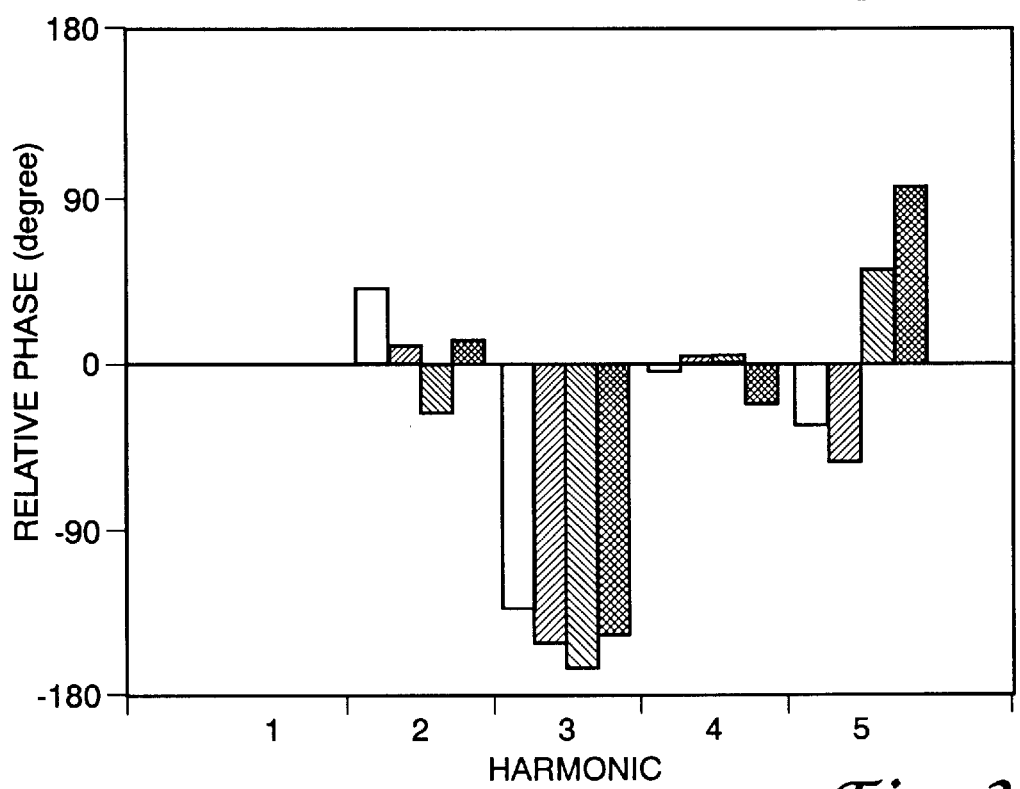
FIG. 3b shows signal phase measurements indicating the non invasive characteristics of the present invention.

To illustrate the non-invasive nature of the preferred FIG. 1 high impedance probe the FIG. 3a and FIG. 3b drawings of FIG. 3 show the fundamental frequency and harmonic frequency contents of an MMIC amplifier output signal and the changes occurring in these output signal components under conditions of different couplings of the FIG. 1 probe to the MMIC circuit. At 300 in the FIG. 3a drawing the fundamental frequency output of the MMIC is represented under conditions of the FIG. 1 probe being disposed in four different locations with respect to the single transistor stage comprising a 28 dBm driven 5 gigahertz MMIC power amplifier. As represented at 306 in FIG. 3a, the FIG. 1 probe is disposed near (about one centimeter away) but not in contact with the drain electrode of the transistor. As represented at 308 in FIG. 3a the FIG. 1 probe is placed in actual contact with the drain electrode of the transistor. At 310 in FIG. 3a the FIG. 1 probe is disposed in contact with the gate electrode of the transistor. In a similar manner at 312 in FIG. 3a the FIG. 1 probe is disposed in contact with a matching element of the transistor. At 302 and 304 in the FIG. 3a drawing these same transistor connections and shaded data representations prevail for the second and third harmonic frequencies of the fundamental frequency represented in the bar graph 300. Similar bar graphs for the fourth and fifth harmonic frequencies are shown in the rightmost portion of FIG. 3a. Again it is significant to recall that the FIG. 3a graphs represent the MMIC amplifier output at its normal output terminal under the conditions of these respective probe connections within the amplifier.

With these connections the near but not in contact graph bars, 306 etc., for each of the frequencies in FIG. 3a indicate the normal or undisturbed-by present probing output of the MMIC amplifier and each of the three adjoining bar graphs indicate the signal attenuation or increase observed at the amplifier's output terminal as a result of the above identified probe connections with an amplifier node. It can be seen that the fundamental frequency output signal is not affected by the respective high-impedance probe connections whereas variations in higher harmonic frequency signal magnitudes are less than 40 dB of the fundamental. FIG. 3b of the drawings represents observed changes in phase angle of the respective harmonic frequency components in the amplifier output signal in response to these same high impedance portable test probe connections to the MMIC amplifier.

Turning now to the interrelated topics of probe 222 grounding to the MMIC device-under-test 220 in the FIG. 2 drawing and the calibration of a FIG. 1 or related type of probe for use in the present invention, we have experimentally evaluated various probe grounding arrangements, both on and off of a tested wafer in the course of work leading to the present document. These evaluations show that if the probe impedance and the employed measurement frequency are each sufficiently high, a probe grounding contact at the probe tip is not critical and, hence, can be omitted—omitted if certain accommodations in calibrating the probe are accomplished.

Figure 4A:
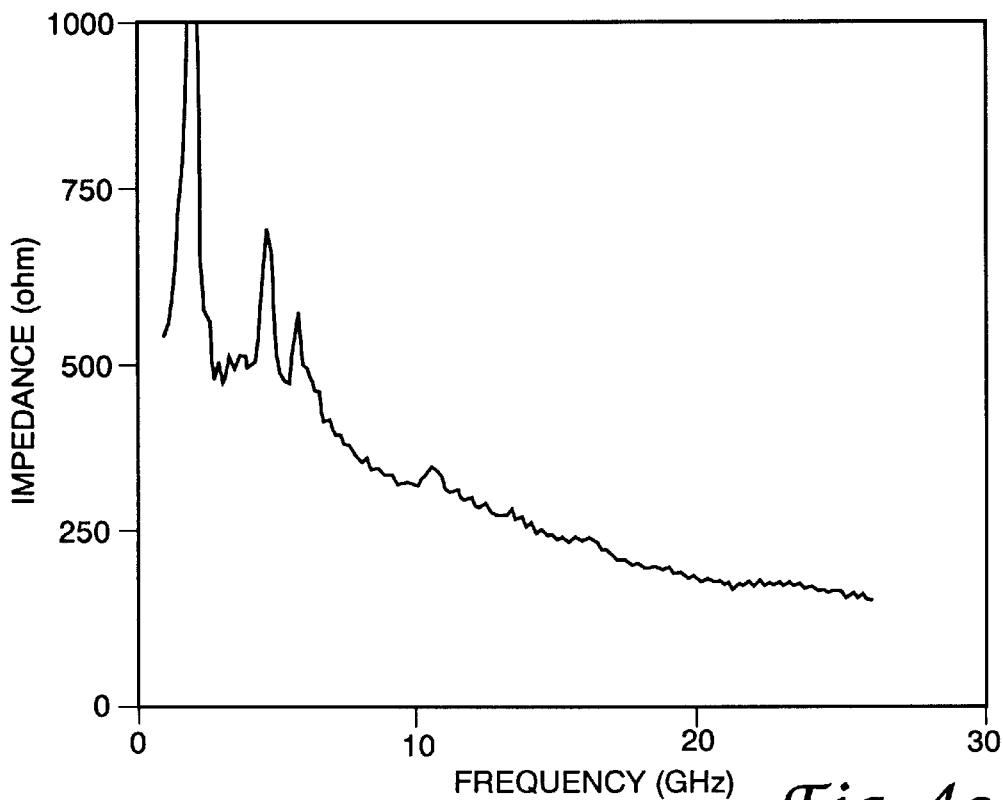
FIG. 4a shows frequency responsive impedance characteristics of a FIG. 1 probe type.
Figure 4B:
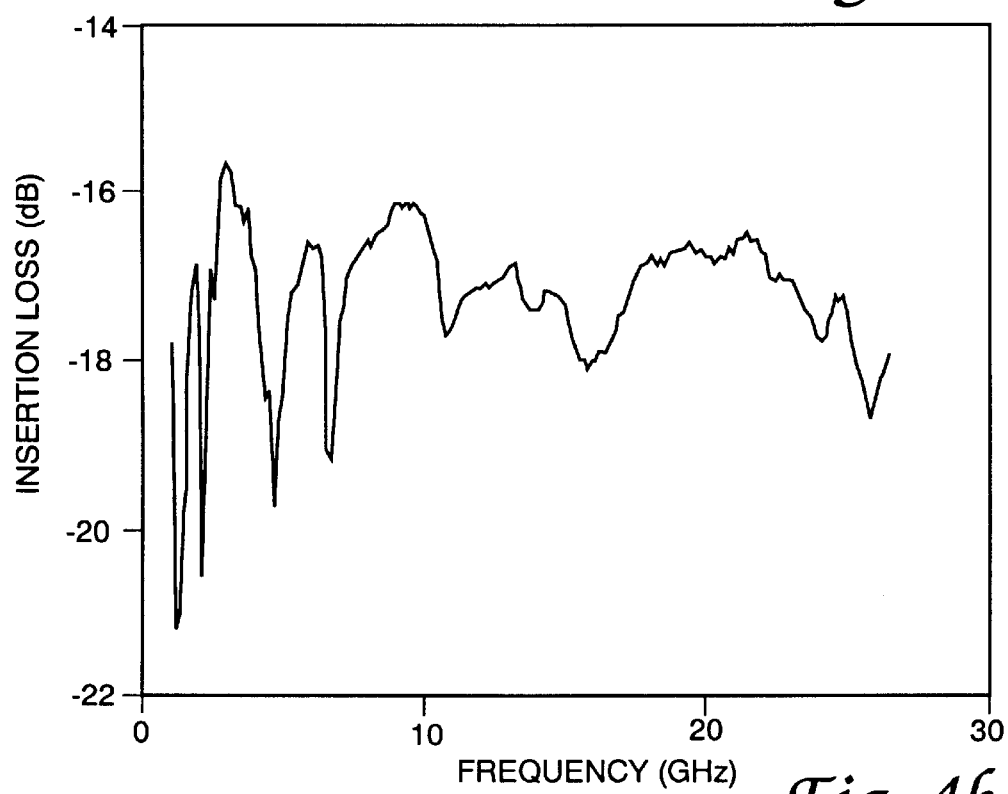
FIG. 4b shows frequency responsive insertion loss characteristics of a FIG. 1 probe type.

To more fully appreciate these considerations, the FIG. 4a and FIG. 4b parts of the FIG. 4 drawing show the measured input impedance and insertion loss respectively for a 500 ohm probe of the FIG. 1 type as functions of frequency. One aspect of these FIG. 4 characteristics, the FIG. 4a probe input impedance, is shown to vary between the intended 500 ohm value at the lower microwave frequencies through a gradual decrease region down to a lower value near 160 ohms at a frequency of 26 gigahertz. Although this impedance level is lower than desired for probing many signal nodes within a microwave or millimeter wave circuit, and may cause significant perturbance to the MMIC under test, it is yet significantly improved over the use of a standard 50 ohm probe to be advantageous for such uses. Parasitic coupling capacitance even though minimized in the FIG. 1 probe is believed to cause the input impedance drop to 160 ohms.

Once the FIG. 4a impedance characteristics are measured, the frequency dispersion can be readily calibrated for the present frequency-domain technique. This calibration may for example use a look-up table which lists the loss at each frequency so that the measured fundamental and harmonic signals can be corrected by the loss at each frequency. The phase delays at each harmonic frequency can be similarly corrected.

The FIG. 4b insertion loss, being approximately 18 dB, is caused by the potential divider of the resistor 104 and other loss mechanisms. The probe insertion loss, being less than 20 dB, is not a concern in the present invention due to the large dynamic range of the HP transition analyzer at 202 as mentioned above.

Turning then to another aspect of the FIGS. 4a and 4b drawings, the above mentioned probe calibration considerations which enable use of the preferred ungrounded condition of the FIG. 1 probe at the device-under-test may also be appreciated from a consideration of the FIG. 4a and FIG. 4b drawings. The low frequency resonances, appearing at frequencies near 2 and 5 gigahertz in FIG. 4a and FIG. 4b, are caused by the preferred omitting of the probe ground contact at the device-under-test. These resonances can significantly distort the time domain waveform. These resonances, notwithstanding their appearance in the FIG. 4 drawings however, can be readily calibrated out of or compensated-for in the probe-accessed data as indicated in the above look-up table discussion. Such calibration or compensation can be referred to as resonance peak effects-inclusive calibration of the test probe and transmission line member; in some instances measurement frequency selection can also be used. Since these low frequency resonances can move in frequency location to some degree depending on the circuit to which the probe is connected, it is desirable to accomplish calibration with the probe connected to circuitry as similar to that to be measured as possible.

It is desirable for the physical dimensions or electrical characteristics of the FIG. 1 probe and its attached coaxial cable transmission line to be selected such that their resonant frequency falls below that of the selected frequency of measurement. Other variations of this concept are of course also possible, variations such as accepting an inherited probe resonant frequency but selecting the frequency of measurement to fall above this inherited resonant frequency. A selection of the frequency of measurement to fall below the inherent resonant frequency of the probe is also possible.

The complete calibration procedure mainly involves characterization of frequency dispersion of the probe—an advantage for the present technique over conventional time-domain-based techniques because time domain measurement typically only corrects for a single loss and time delay, presumably for the fundamental frequency. The calibration may be performed on a microwave network analyzer, with a high-impedance probe and a standard 50 ohm probe contacting the two ends of a 50 ohm through line. The 50 ohm probe and the through line should be previously calibrated using standard frequency-domain techniques. Therefore, they can be de-embedded from the measured S-parameters to arrive at the S-parameters of the high-impedance probe. Ideally, to properly account for the coupling capacitance between the high-impedance probe and the transmission line under test, the through line used in the calibration should have similar dimensions as the transmission line under test. However, this requirement can be relaxed when the probe tip is smaller than the transmission line width. After the probe and the associated connectors and cables are calibrated, the waveforms measured at the transition analyzer can be transformed to the very tip of the probe, where it intercepts the transmission line under test. This transformation can be achieved through the use of S-parameters of the probe.

Figure 5:
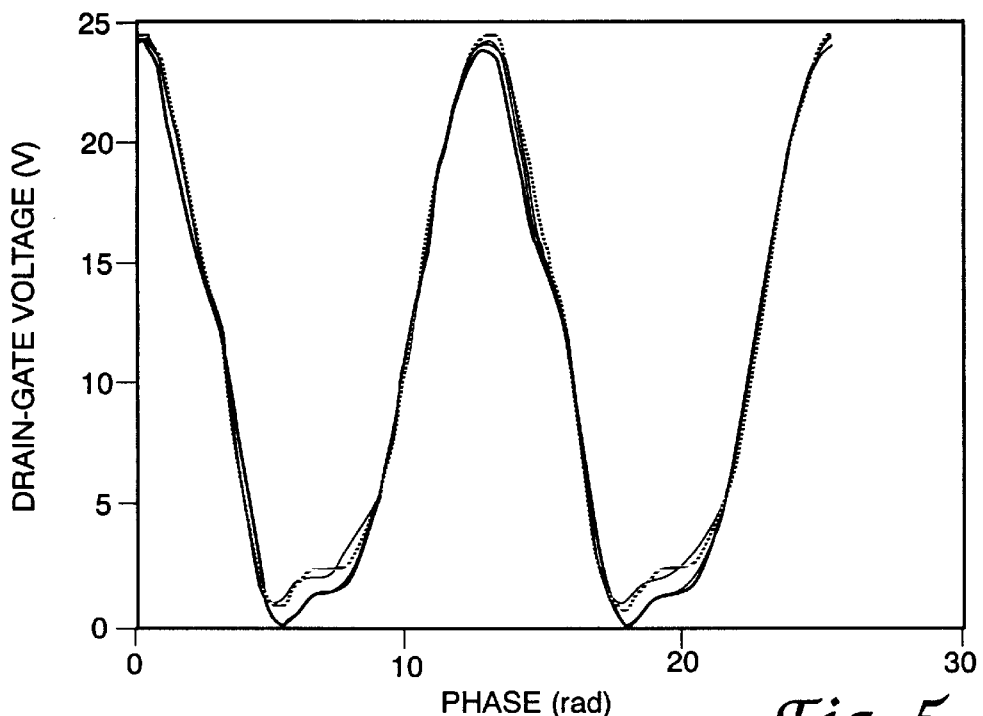
FIG. 5 shows a voltage-frequency waveform comparison for the same node in three similar integrated circuit devices using two different FIG. 1 probes.

To illustrate the reproducibility of the present measurement and calibration technique, FIG. 5 in the drawings shows the drain-gate voltage waveforms measured by two different probes from the unit cell of the same location on three different MMICs. In the FIG. 5 drawing drain-gate voltage waveforms are measured by probes having 500 ohm and 1000 ohm impedances, respectively using the unit cell of the same location on three different MMICs as signal sources. In each FIG. 5 instance the input drive is 33 dBm at 5 GHz. In connection with FIG. 5 the difference between the same unit cell of different MMICs is found to be smaller than the difference between different unit cells of the same MMIC. This emphasizes the reproducibility of both the MMIC fabrication and testing techniques. The dynamic range achieved by the present measurement technique encompasses the voltage range of typical MMICs.

Figure 17:
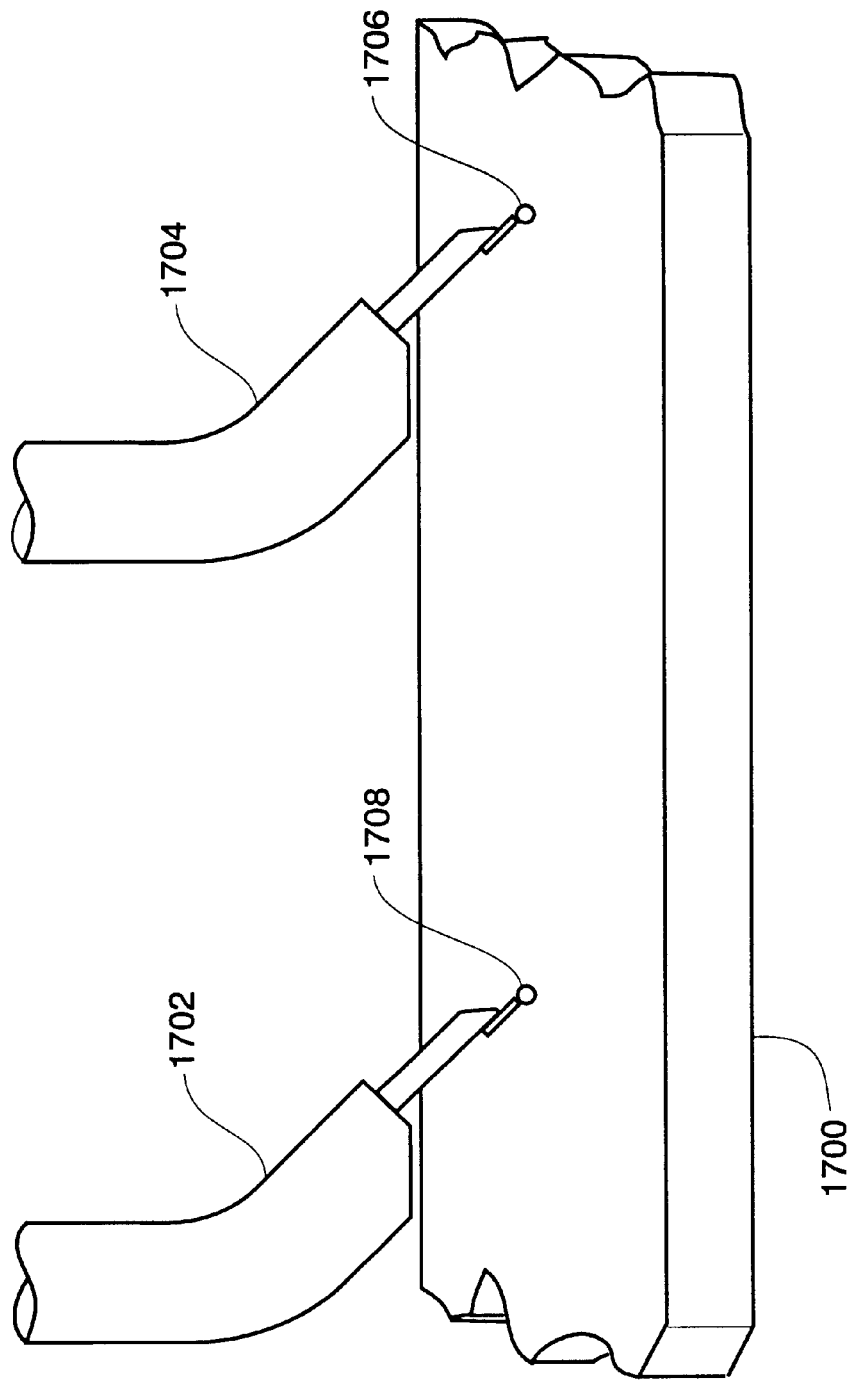
FIG. 17 shows a MMIC transmission line conductor and two signal sampling probes according to present invention disposed thereon.

Turning now to a different measurement aspect of the invention, from the voltage waveforms measured at two different locations on a transmission line, the waveform of current flowing in the transmission line can be determined with use of the microwave transition analyzer instrument and the present invention techniques. In a broader sense of this concept it is also possible to use the techniques of the present invention to determine the waveform of a current flowing through any element of known impedance using the techniques of the invention. FIG. 17 in the drawings shows in representative form such a positioning of two FIG. 1 type probes, 1702 and 1704 on first and second signal nodes 1706 and 1708 disposed along a transmission line conductor 1700 within a MMIC device in the manner usable to perform such current measurement. For the former transmission line instance this current determination may be accomplished as follows. Giving the N-th harmonic voltages measured at two adjacent locations, $V_N$ and $V_N'$, the incident and reflected harmonic voltage waves, $A_N$ and $B_N$, can be calculated according to the following two equations from standing wave theory:

$$A_N = \{V_N \exp(jNwt) - V_N'\}/2 \sin(Nwt) \quad (1)$$

$$B_N = -\{V_N \exp(-jNwt) - V_N'\}/2 \sin(Nwt) \quad (2)$$

The harmonic current, $I_N$, is then evaluated by $$I_N = (A_N - B_N)/Z_0 \quad (3)$$

where $A_N$ and $B_N$ are the incident and reflected harmonic voltage waves, $V_N$ and $V_N'$ are the N-th harmonic voltages measured at two adjacent locations, j is the square root of negative one; w is the angular frequency; t is the time it takes for the wave to propagate between the two locations and $Z_0$ is the characteristic impedance of the transmission line under test. Ideally, the distance between the two transmission line locations probed should be chosen so that the phase delay for the highest harmonic of interest is close to, but not greater than 180 degrees. These equations are well known in the transmission line art and are for example disclosed and discussed in some detail in chapter one of the textbook "Microwave Circuit Design Using Linear and Nonlinear Techniques" authored by A. M. Parino and U. R. Rohde and published by John Wiley and Sons, New York, 1990.

Figure 6:
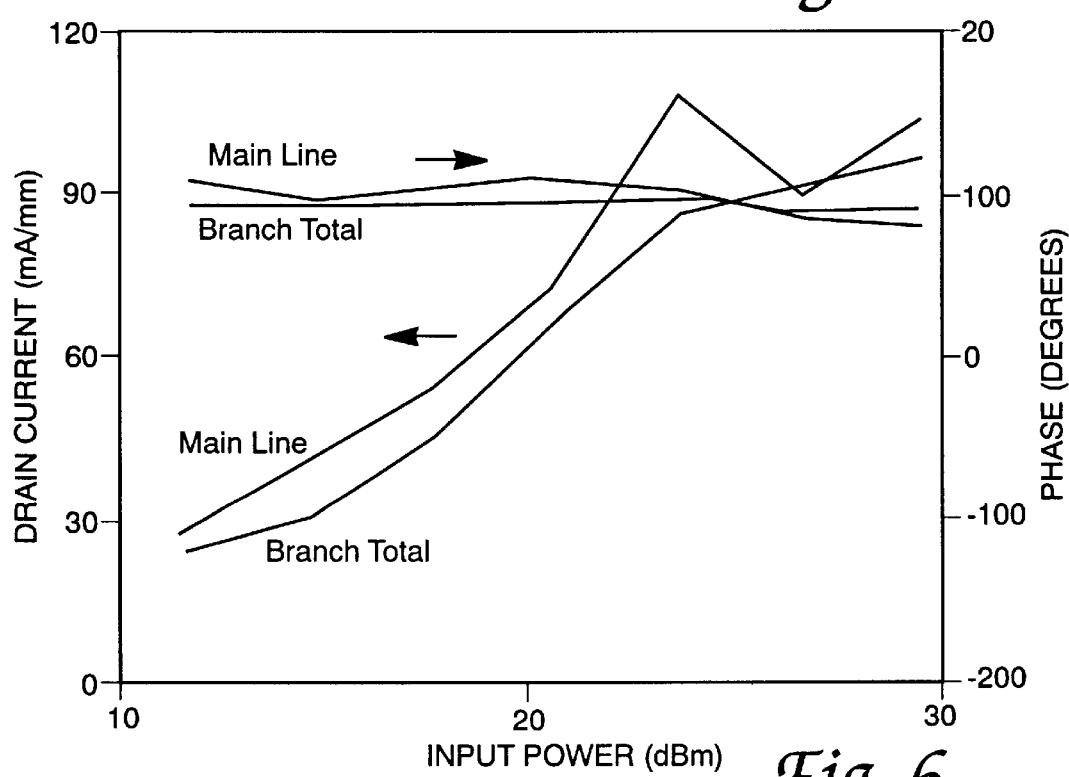
FIG. 6 shows amplitude and phase relations for component and summed currents at a transmission line Tee junction.

FIG. 6 in the drawings shows the results of what may be called a self-consistency test verification of the present measurement invention. The FIG. 6 self-consistency test involves the currents flowing at a transmission line "T" junction for example and the test compares current measured on the main line of the "T" junction with the sum of the currents measured on the two branch lines of the "T" junction. The FIG. 6 arrows indicate data relevance to the left hand current scale or the right hand phase angle scale. The FIG. 6 measurements include input power level as a horizontal axis variable and indicate currents measured at a frequency of 5 gigahertz. The FIG. 6 data indicates that when branch currents measured according to the invention are added together, they are within ±10% of that measured on the main line, in terms of both magnitude and phase. As evidenced by the FIG. 6 test and additional tests described subsequently herein, with carefully considered calibration and test procedures, the accuracy of measurements accomplished according to the present invention appears to be limited primarily by the error of the transition analyzer instrument itself. Table I which appears below lists the worst-case estimate of major error sources. Theoretically, the worst case error can be ±11% in magnitude and ±10 in phase. In practice, the error is usually much smaller than the worst case estimate. This is especially true with signal averaging in CW measurements.

TABLE I

WORST-CASE ERROR ANALYSIS

| Source of Error | Magnitude Error | Phase Error |
| --- | --- | --- |
| Transition Analyzer | ±10% | ±7 |
| Probe Calibration | ±1% | ±3 |
| Probe Positioning | <1% | <1 |

Figure 7:
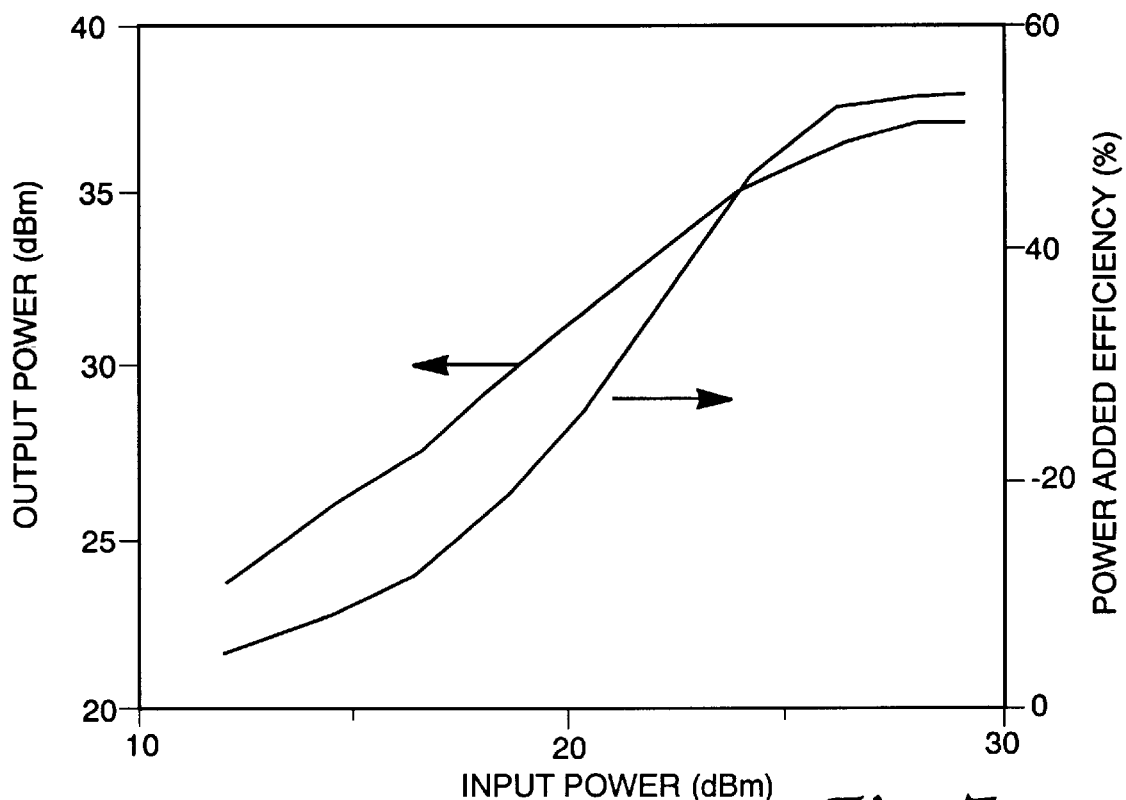
FIG. 7 shows an efficiency and output power indicator of power performance in an integrated circuit probe-tested according to the invention.

FIG. 7 in the drawings shows the power performance of a MMIC amplifier operating at a frequency of 5 gigahertz. Similar performance is obtained from 4 to 6 gigahertz operation, with somewhat lower output power occurring at 4 or 6 gigahertz. Input powers of 26, 28, and 33 dBm correspond to gain compressions of 1, 3 and 8 dB, respectively in the FIG. 7 data. The FIG. 7 data and each of the additional Figures after FIG. 7 in this document relate to measurements made on a microwave C-band, single-stage, 5 watt, MMIC amplifier. The MMIC amplifier contains four MESFET unit cells. Each MESFET unit cell comprises twenty gate fingers. Each gate finger is 0.5 micrometer long and 175 micrometers wide. The typical drain and gate biases are 9 and 2 Volts, respectively.

Figure 8A:
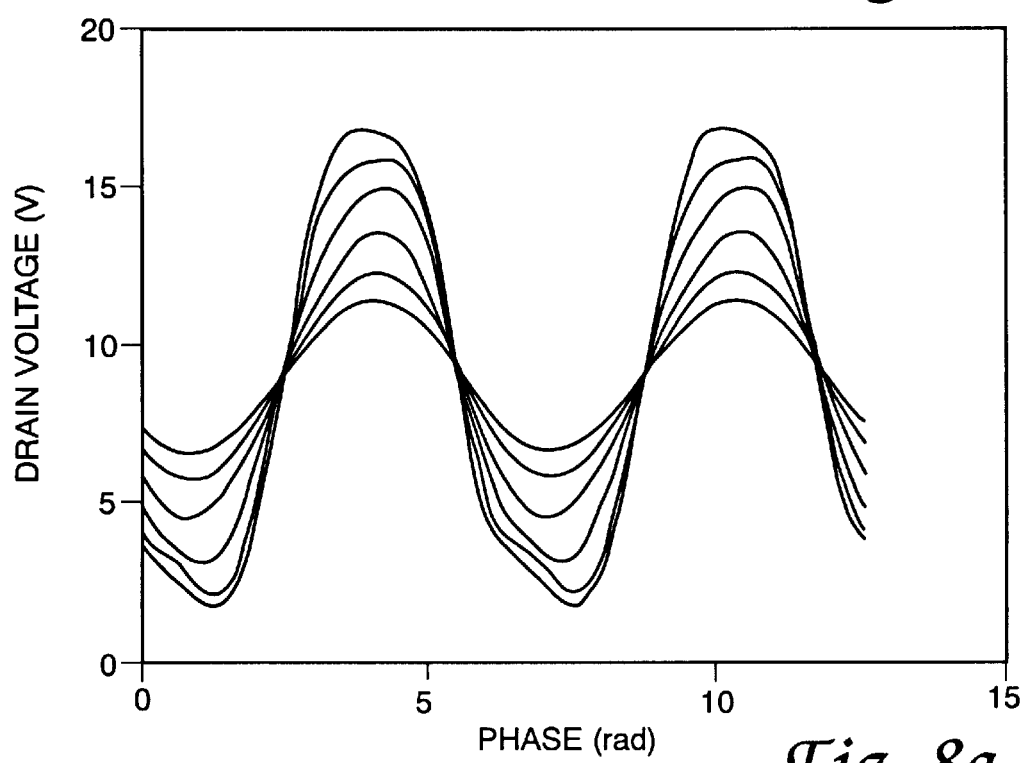
FIG. 8a shows transistor unit cell drain voltages for several input power levels.
Figure 8B:
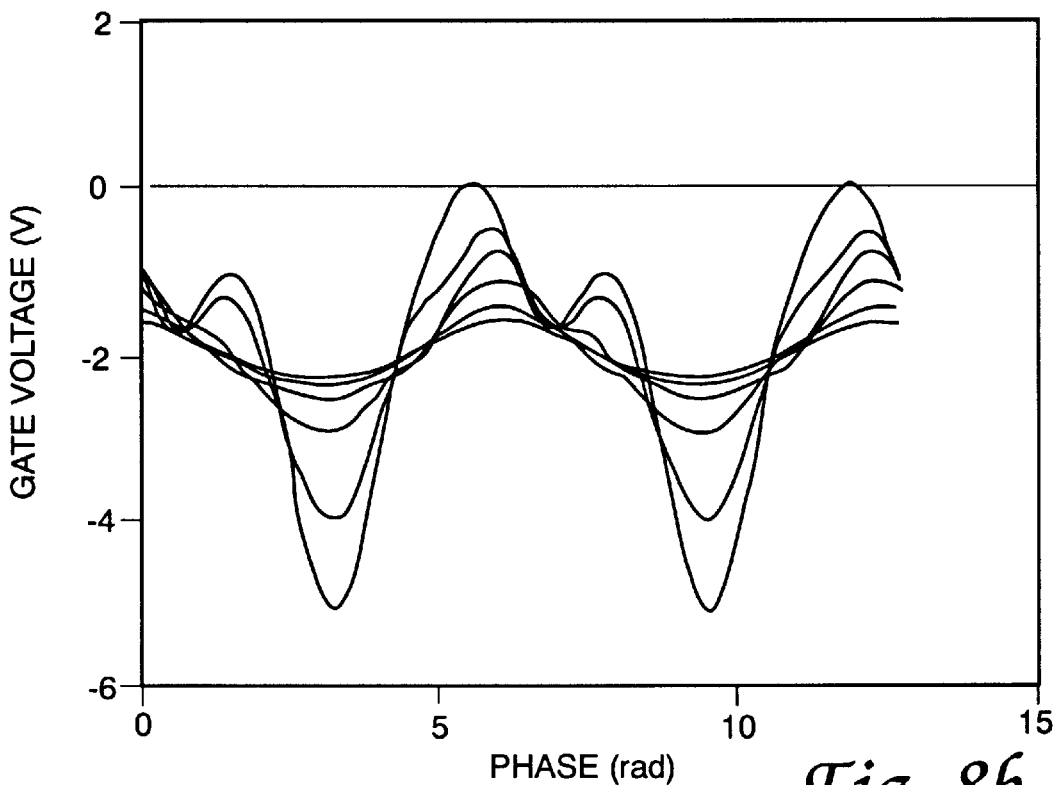
FIG. 8b shows transistor unit cell gate voltages for the FIG. 8a input power levels.

The FIGS. 8a and 8b drawings of FIG. 8 illustrate the unit-cell drain and gate voltages for the C-band, single-stage, 5 watt, MMIC amplifier operated at 5.375 gigahertz under the different input drive levels of 14, 17, 20, 23, 26 and 28 dBm—with the higher input drive levels corresponding with the larger drain voltage swing in FIG. 8a and with the larger gate voltage swing in FIG. 8b and also with greater nonlinear distortion for both voltages. The FIG. 8a voltages are measured on the unit-cell output and input lines, after all twenty fingers are interconnected and before any matching element is branched on. It can be seen that, under the lower amplitude linear drive levels, the drain voltage lags the gate voltage by approximately 1 rad. Once the drive exceeds 26 dBm, corresponding to approximately 1 dB gain compression, both drain and gate voltages are greatly distorted and their phase relationship becomes ambiguous.

Figure 9A:
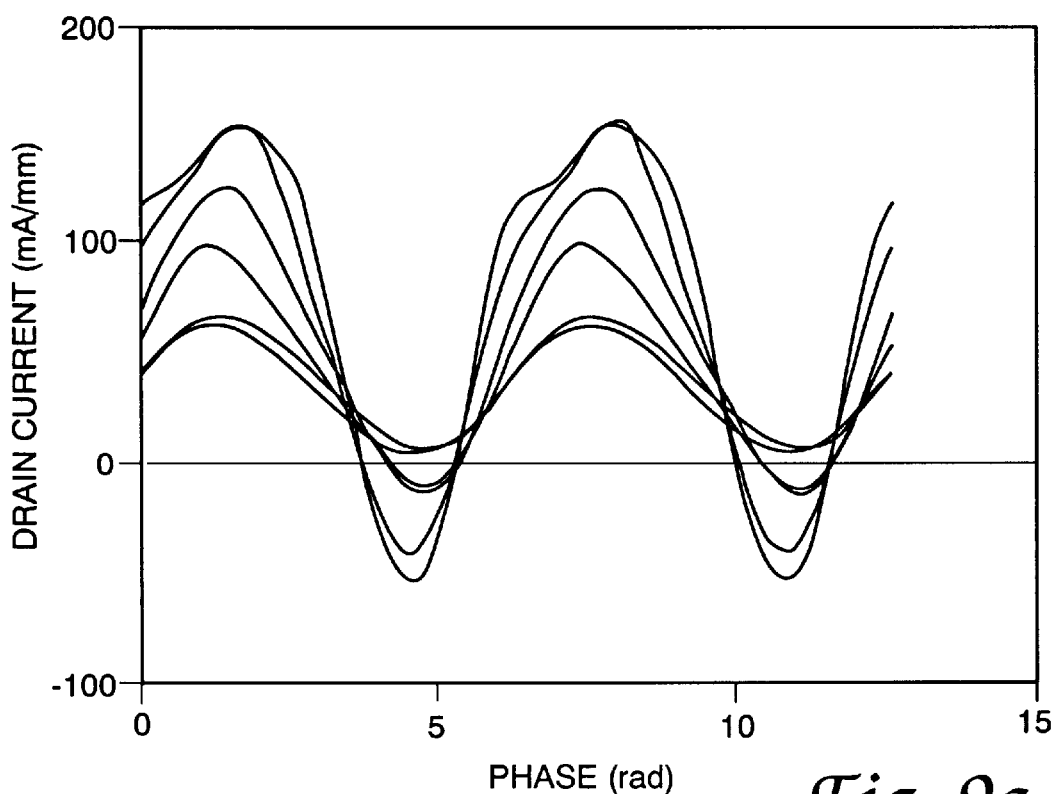
FIG. 9a shows transistor unit cell drain current for the FIG. 8a input power levels.
Figure 9B:
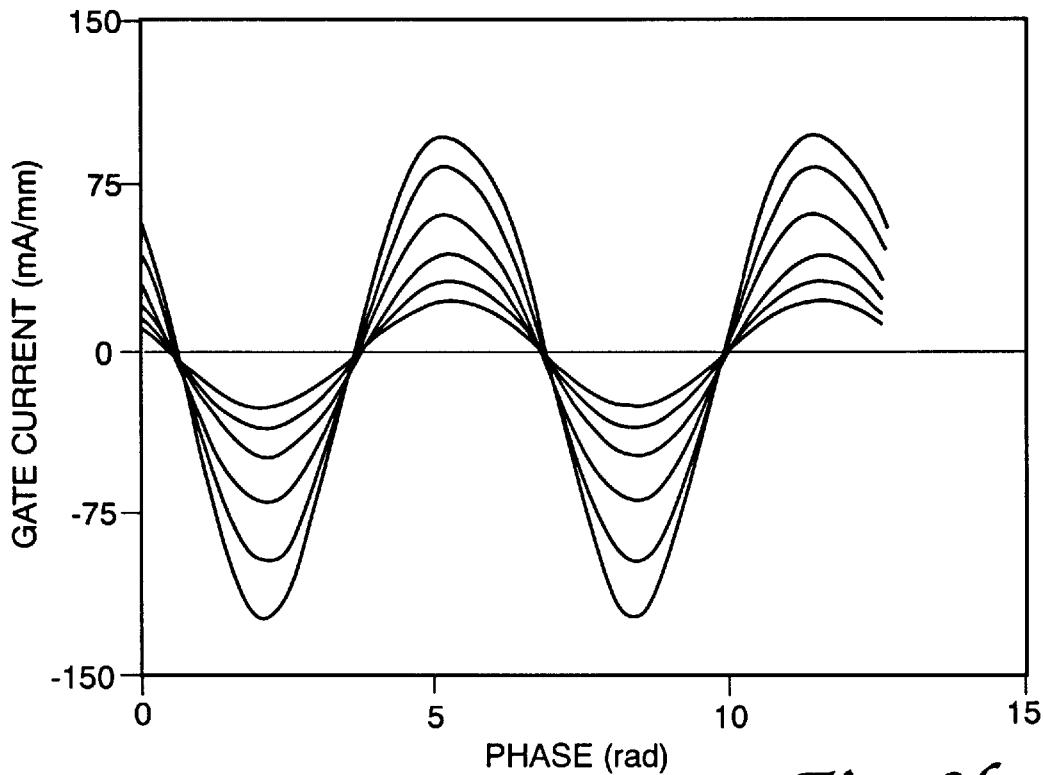
FIG. 9b shows transistor unit cell gate current for the FIG. 8a input power levels.
Figure 10:
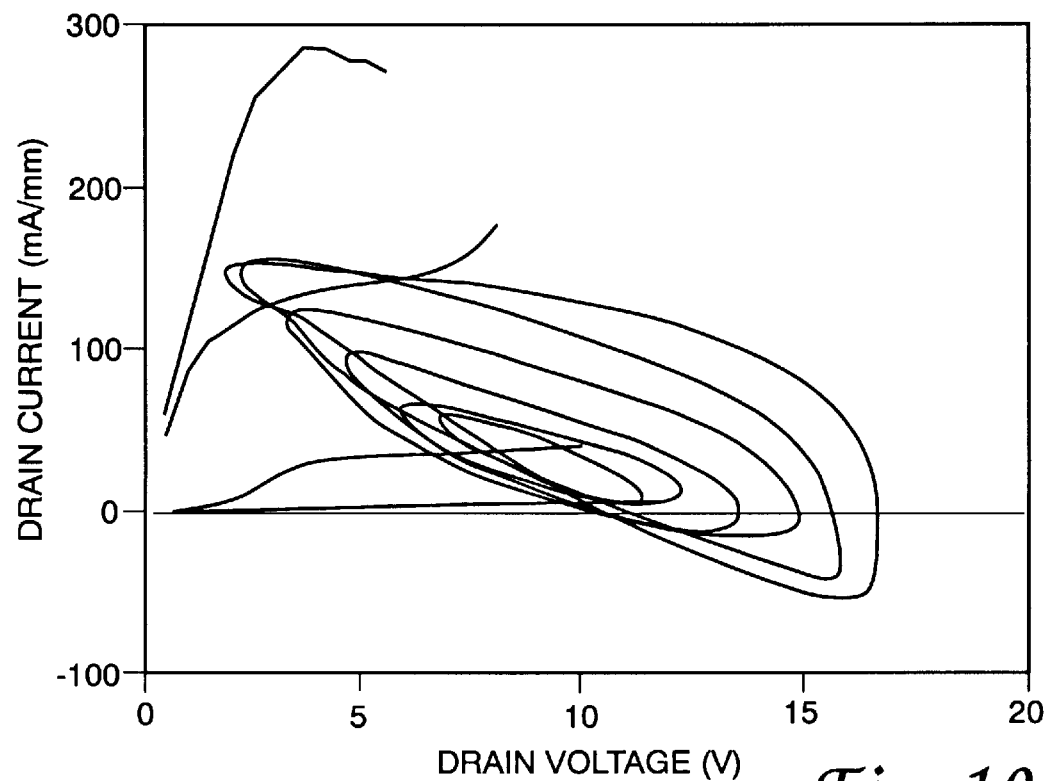
FIG. 10 shows the dynamic load lines vs. direct current drain characteristics determined according to the present invention for a MMIC unit cell.

The FIGS. 9a and 9b drawings of FIG. 9 illustrate the unit-cell drain current and gate current for the C-band, single-stage, 5 watt, MMIC amplifier operated at 5.375 gigahertz under the different input drive levels of 14, 17, 20, 23, 26 and 28 dBm. The FIG. 9 current measurements therefore represent currents which are measured through difference voltage measurements according to the present invention and include a utilization of the above recited equations 1, 2 and 3. From voltage waveforms measured at different locations along each branch line of the C-band transistor, the total unit-cell drain and gate currents of FIG. 9 can be determined. The dynamic load lines of FIG. 10 can be plotted from the measured drain current and voltage waveforms of FIG. 8 and FIG. 9. FIG. 10 also includes as references the dc drain characteristics, measured under gate bias of 0, negative 1, and negative 2 volts and shown in the upper left of the FIG.

Conventional output impedance matching would have the FIG. 10 dynamic load contour intercept the knee of the dc drain current curve in order to maximize the saturated output power of the amplifier. It can be observed in FIG. 10 however that a relatively high matching impedance was used to allow the load line to swing below the knee, thereby achieving higher power-added efficiency but lower saturated output power. Such a high-impedance match also causes the drain voltage to swing higher. This, together with a large gate-voltage swing, may however be a reliability concern in exceeding the threshold voltage for onset of gate to drain breakdown and hot-electron-induced transistor degradation. These FIG. 10 related observations therefore illustrate the type of information provided by the present invention measurements and the utility of these measurements in optimizing tradeoffs encountered in the operation of a MMIC device.

Figure 11:
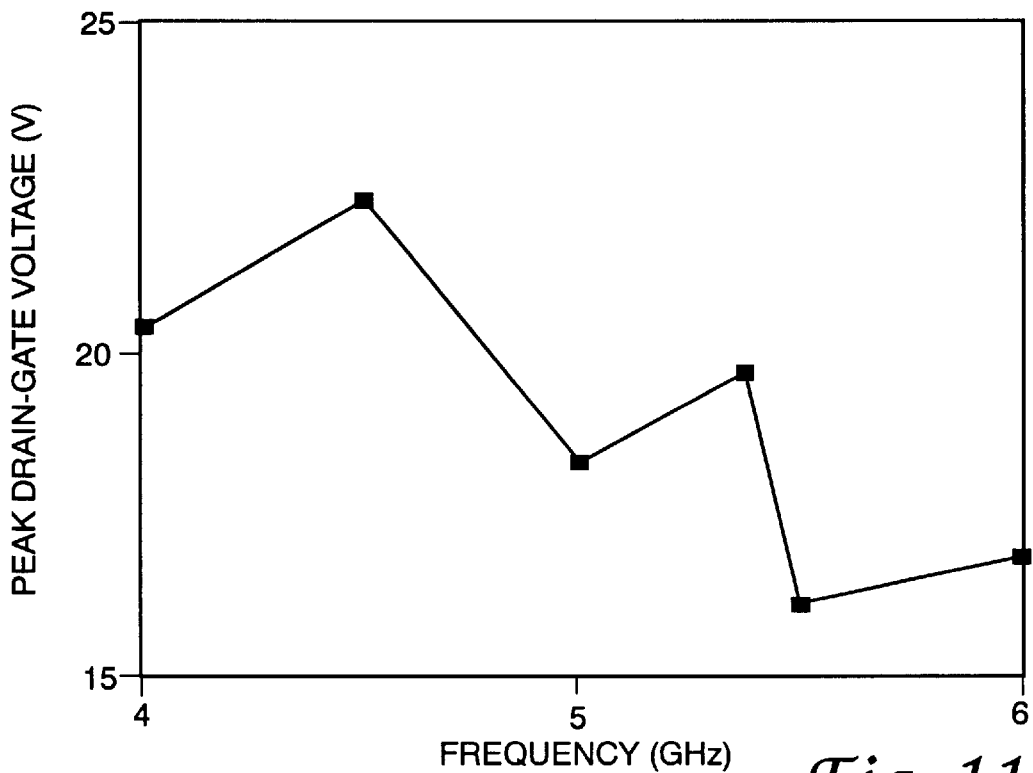
FIG. 11 shows invention measured frequency responsive drain to gate peak voltages for a MMIC unit cell.

FIG. 11 in the drawings shows peak drain-gate voltages from 4 to 6 gigahertz, calculated from the drain and gate voltage waveforms measured at each input frequency. Significantly FIG. 11 illustrates that the peak drain-gate voltage measured with an input drive of 28 dBm can exceed 22 volts at certain frequencies even though the applied drain bias is only 9 volts and the gate bias only negative 2 volts. Such a peak voltage may in fact cause gate to drain breakdown of the MESFET. Therefore, the conventional wisdom practice of biasing a field effect transistor drain at half of its dc breakdown voltage (measured with the gate voltage at pinch-off) may not be adequate to protect the transistor from degradation. It is significant to note therefore that using the present waveform probing technique, it is possible to quantify the deep breakdown characteristics of a MMIC application under conditions where dc measurement would cause MESFET burn out destruction. Also the FIGS. 10 and 11 waveform results indicate that RF breakdown characteristics may or may not agree with predictions extrapolated from the dc characteristics of a device.

Figure 12:
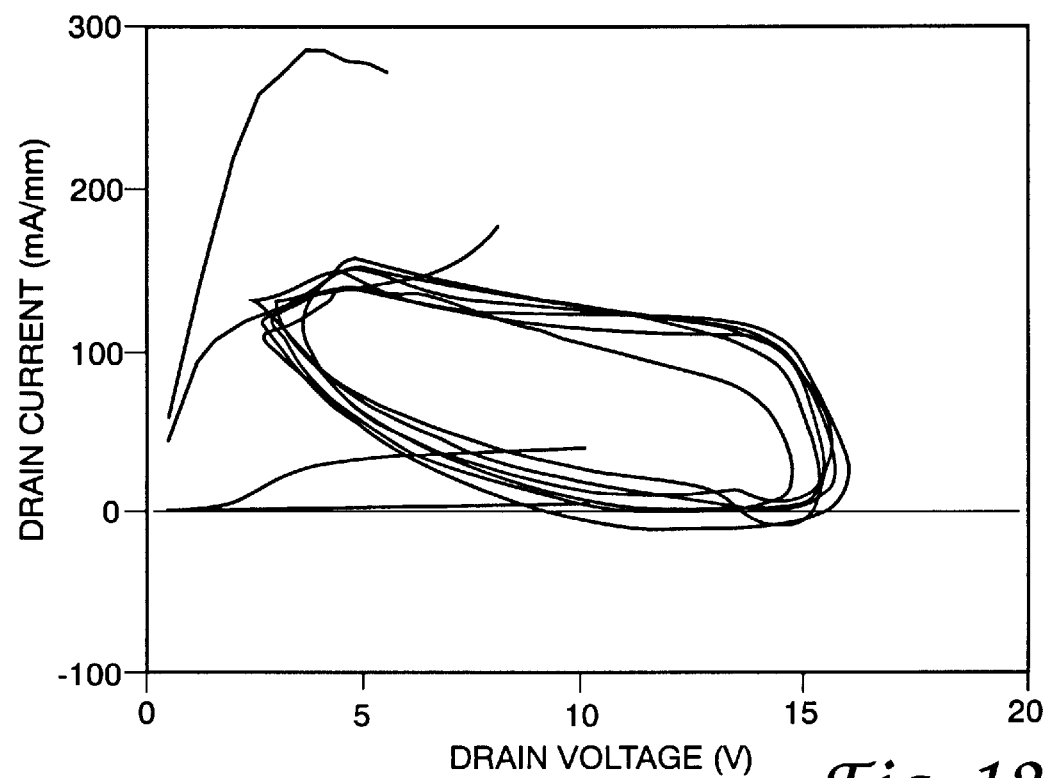
FIG. 12 shows invention measured FIG. 10 type dynamic load contours for a different MMIC unit cell under overdriven operation conditions.

As another illustration of the use and advantages of the present invention, an assessment of the electrical stresses experienced by a MMIC unit cell under RF overdrive conditions may be considered. FIG. 12 in the drawings shows drain voltage and drain current dynamic load line characteristics for another MMIC amplifier operated under the FIG. 10 conditions and driven at 5 GHz with an input power of 28, 29, 30, . . . 33 dBm. At the 33 dBm. level this represents 8 dB of compression. Under such a large electrical stress, long-term gradual degradation expected under normal operations can often be accelerated into occurrence within a few hours. In the FIG. 12 characteristics it can be seen that the drain voltage is clamped at 16 volts. However, the peak drain to gate voltage continues to increase with increasing input power due to increased gate-voltage swings. The load linesat 28 dBm for this MMIC is similar to that for the MMIC shown in FIG. 10, confirming again the reproducibility of both the MMIC fabrication and testing techniques.

Figure 13:
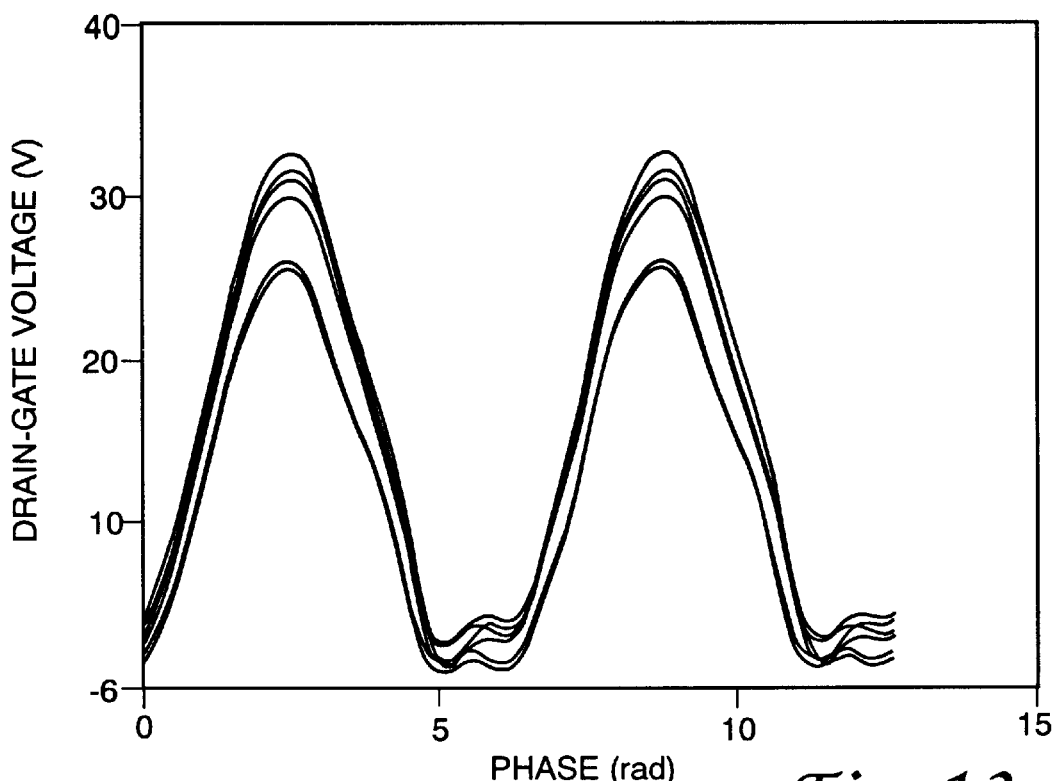
FIG. 13 shows several unit cell drain-to-gate voltage waveforms for a MMIC unit cell subjected to concurrent direct current and radio frequency stresses.

In FIG. 13 the drain bias of a C-band, single-stage, 5 watt, MMIC amplifier, operated at 5 gigahertz is stepped through the levels of 8, 10, 11, 12, 13 and 14 volts while the gate bias and the input power are held at 2 V and 33 dBm, respectively. The FIG. 13 curves show that the peak drain-gate voltage increases approximately linearly with the drain bias under these conditions. From the detailed waveforms, this increase is also due primarily to the increased negative swing of the gate voltage.

Figure 14:
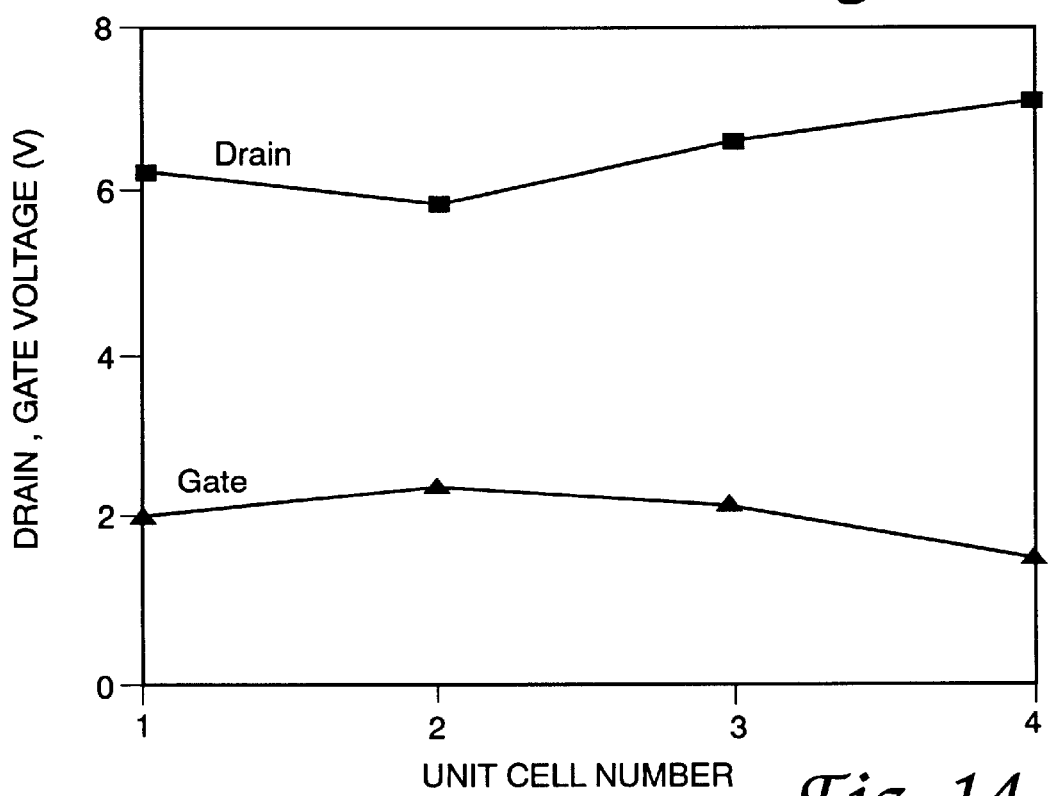
FIG. 14 shows a range of fundamental frequency drain and gate voltage variations for four unit cells of a MMIC device.
Figure 15:
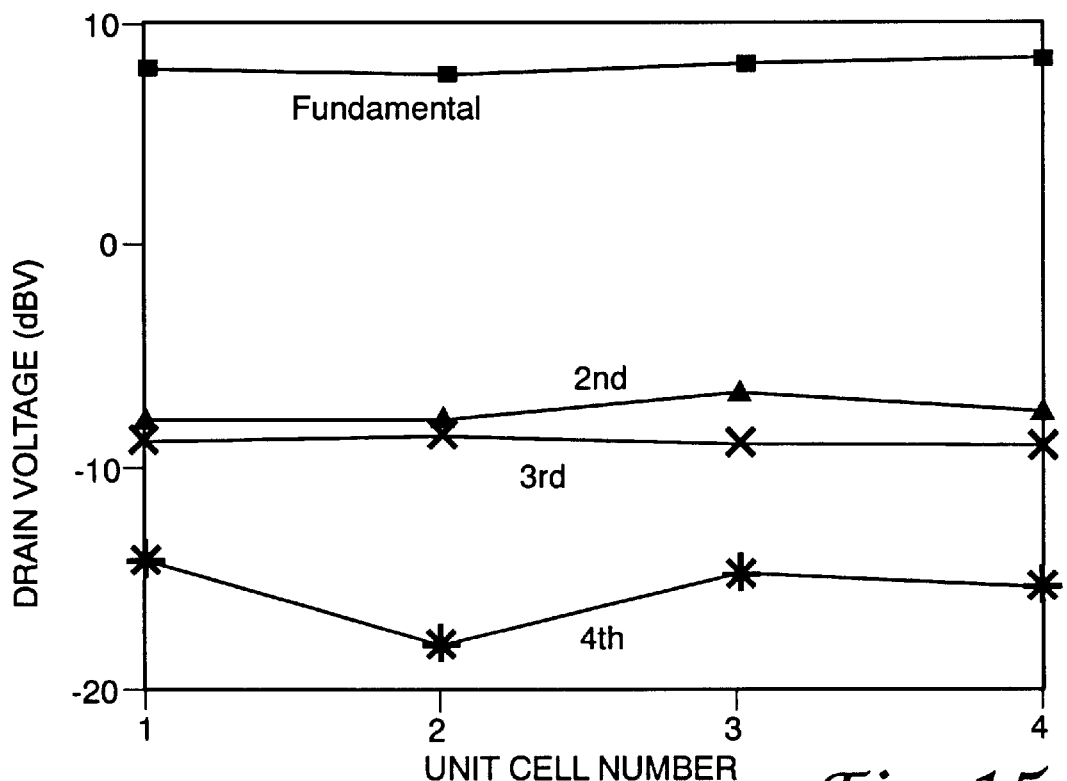
FIG. 15 shows four harmonic frequency components for the FIG. 14 unit cell voltages.

FIG. 14 of the drawings demonstrates an application of the herein disclosed microwave and millimeter wave measurement arrangement within the integrated circuit to yet another area of frequent interest. In FIG. 14 the question of unbalance between the transistors of a MMIC power amplifier is examined using this herein disclosed measurement arrangement. In such a device it is reasonable to expect circuit interactions or processing and heat-sinking variations to cause the internal voltages incurred at similar but physically displaced electrical nodes in the device to vary. With use of the present invention it is possible to show that such voltages can in fact vary from unit cell to unit cell in addition to being a function of input frequency and power. FIG. 14 shows the fundamental magnitude of drain and gate voltages measured on each unit cell of a 5 GHz. MMIC amplifier operated at 28 dBm. In FIG. 14 it can be seen that the variation in drain voltage found in this device is comparable to the measurement error, however significant variation in gate voltage exists between inner and outer unit cells. The inner cells appear to have higher input level (probably due to their shorter input paths) but lower gain (probably due to higher operating temperature) than the outer unit cells. In the case of FIG. 14 these two effects compensate each other to even out the output level. FIG. 15 shows that higher harmonic components of the FIG. 14 device have also been uniformly suppressed to below negative 15 dB FIG. 15 the top curve relate component. In FIG. 15 the top curve relates to fundamental frequency component, the next curve to the second harmonic component, the third or x-marked curve to the third harmonic component and the lowest curve to the fourth harmonic component.

Figure 16:
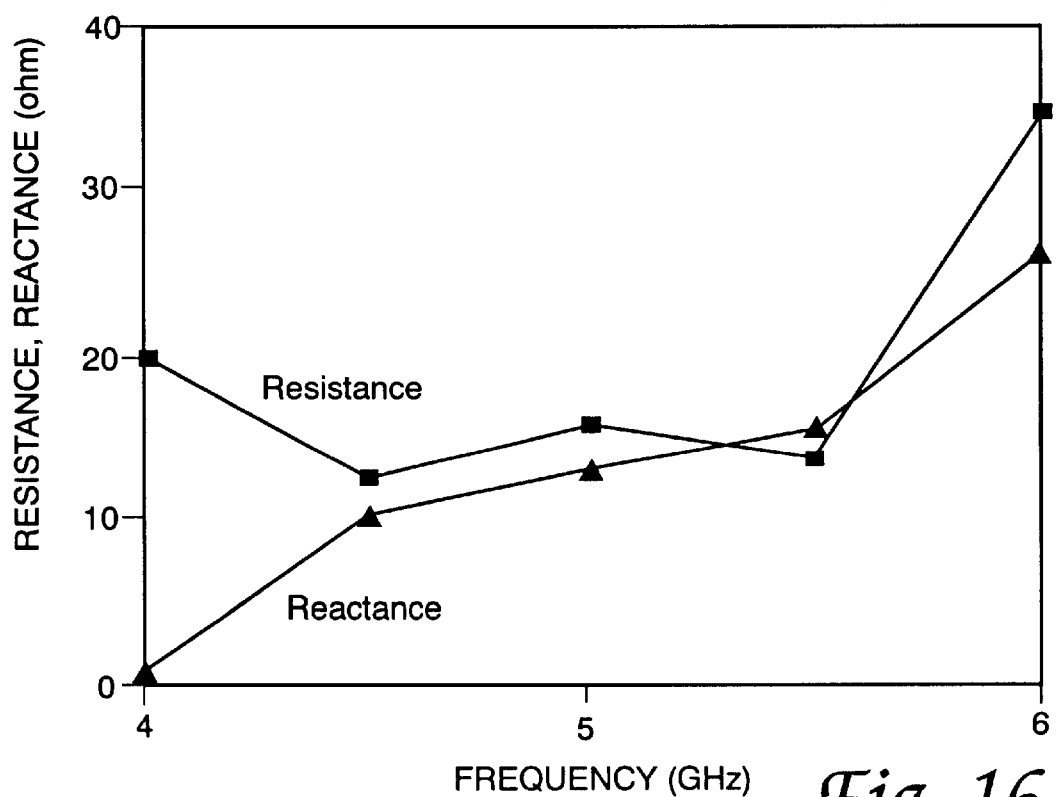
FIG. 16 shows present invention-determined resistive and reactive components of the load experienced by a MMIC unit cell over a selected band of operating frequencies.

FIG. 16 of the drawings shows an application of the present invention measurement arrangement to a determination of the circuit impedance experienced by a unit cell of a MMIC device. FIG. 16 therefore represents a verification of a circuit design through calculation of the circuit impedance experienced by a unit cell from waveforms measured according to the present invention. The FIG. 16 curves represent the fundamental load impedance experienced by a unit cell operated over the frequency range of 4 to 6 gigahertz with the square marked FIG. 16 curve representing the resistive load component and the triangle-marked curve representing the reactive load component. In these curves it can be seen that the load impedance is rather constant from 4.5 to 5.5 gigahertz. The load resistance is higher at both 4 and 6 gigahertz, while the load reactance is lower at 4 gigahertz but higher at 6 gigahertz. The resulting mismatches at 4 and 6 gigahertz may explain the measured output roll-off at these frequencies which has been alluded to earlier in this document. Not with standing the FIG. 16 variations, the load reactance is always inductive as is needed for conjugate match to the unit cell output reactance, the latter being always capacitive.

In conclusion, an MMIC internal-node waveform probing technique has been disclosed and demonstrated by way of a series of example measurements. These example measurements demonstrate the circuit insight obtainable from the variation of waveforms as a function of frequency, drive and location. In these example measurements the peak swing of a MESFET drain to gate voltage under different drive conditions is quantified. This information can be used for example to predict a MMIC lifetime in view of gradual device degradation under RF overdrive conditions. This information is also found useful in identifying unusual problems such as phase jumping and RF breakdown events and in determining optimum loading for an amplifier device. Variation of unit-cell characteristics within an MMIC are also observed in the disclosed examples and attributed to differences in RF-input and heat-dissipation paths. The load impedance actually experienced by a MESFET within an MMIC is verified to be optimum for the maximum power-added efficiency at somewhat lower saturated output power in another of the example measurements. These examples illustrate the potential for the present technique to impact broadly on for example MMIC design verification, process control and reliability assessment. Although the invention is disclosed largely in terms of MMIC device measurements it is not limited to use with these devices.

While the apparatus and method herein described constitute a preferred embodiment of the invention, it is to be understood that the invention is not limited to this precise form of apparatus or method and that changes may be made therein without departing from the scope of the invention which is defined in the appended claims.

What is claimed is:

1. The operation perturbance-limited method of waveform-analyzing signals of microwave and millimeter wave frequency at circuit nodes internal to an operating integrated circuit electronic device, said method comprising the steps of:

selecting physical and electrical characteristics of an input-ungrounded, high impedance, broadband signal-attenuating, resistive input portable test probe and a transmission line member connected thereto to provide a combined test probe and transmission line resonance frequency below a waveform analyzing frequency selected for said operating integrated circuit electronic device;

communicating, via said input-ungrounded, high impedance, broadband signal-attenuating, resistive input portable test probe, voltage signals from a first selected internal signal node of said operating microwave and millimeter wave frequency integrated circuit electronic device to a transition analysis electronic circuit apparatus;

calibrating out of said input-ungrounded, high impedance, broadband signal-attenuating, resistive input portable test probe-communicated operating microwave and millimeter wave frequency integrated circuit electronic device selected internal signal node voltage signals resonance peak effects attributable to said input-ungrounded, high impedance, broadband signal-attenuating, resistive input portable test probe and transmission line member connected thereto;

remaining microwave and millimeter wave frequency signals being identified as first processed signals;

determining, by harmonic frequency sampling of said first processed signals within said transition analysis electronic circuit apparatus, a fundamental frequency through Nth harmonic frequency-related array of voltage magnitude and phase data, data characteristic of said operating integrated circuit selected internal signal node voltage signals; and constructing, from said array of fundamental frequency through Nth harmonic frequency-related magnitude and phase data, a time domain representation of a waveform characteristic of said selected signal node voltage signals.

2. The operation perturbance-limited method of waveform-analyzing signals of claim 1 wherein said step of calibrating out resonance peak effect portions from said communicated microwave and millimeter wave frequency signals is accomplished by resonance peak effects-inclusive compensation for said effects in said communicated microwave and millimeter wave frequency signals of said signal-attenuating, resistive input portable test probe and transmission line member.

3. The operation perturbance-limited method of waveform-analyzing signals of claim 1 wherein said step of calibrating out resonance peak effect portions from said communicated microwave and millimeter wave frequency signals is accomplished by measurement frequency selection.

4. The operation perturbance-limited method of waveform-analyzing signals of claim 1 wherein said step of calibrating out resonance peak effect portions from said communicated microwave and millimeter wave frequency signals is accomplished by resonance frequency exclusion.

5. The operation perturbance-limited method of waveform-analyzing of claim 1 wherein said input-ungrounded, high impedance, signal-attenuating, resistive input portable test probe is grounded at an output transition analysis electronic circuit apparatus end of said test probe transmission line member.

6. The operation perturbance-limited method of waveform-analyzing of claim 1 wherein said operating integrated circuit electronic device comprises a MMIC power amplifier device.

7. The operation perturbance-limited method of waveform-analyzing of claim 1 wherein said communicated internal signal node voltage signals of said operating microwave and millimeter wave frequency integrated circuit electronic device comprise one of a field-effect transistor gate electrode signal and a field-effect transistor drain electrode signal.

8. The operation perturbance-limited method of waveform-analyzing of claim 1 wherein said determining step Nth harmonic frequency comprises a fifth harmonic frequency of said fundamental frequency.

9. The operation perturbance-limited method of waveform-analyzing of claim 1 wherein said step of constructing a time domain representation of a waveform characteristic of said selected signal node voltage signals comprises use of a fast Fourier Transform algorithm.

10. The operation perturbance-limited method of waveform-analyzing of claim 1 further including the steps of:

repeating said steps of communicating, calibrating, determining and constructing for voltage signals existing at a second selected internal signal node of said operating integrated circuit electronic device, a second selected internal signal node separated by an electrical impedance of known value from said first selected signal node; and determining from said first and second selected signal node voltages and said electrical impedance of known value a current flow in said electrical impedance.

11. The operation perturbance-limited method of waveform-analyzing of claim 10 wherein said first and second signal nodes are located at physically displaced locations along an electrical transmission line conductor.

12. The operation perturbance-limited method of waveform-analyzing of claim 11 wherein said high impedance, signal-attenuating, resistive input portable test probe is characterized by a direct current resistance input of 500 ohms and a signal attenuation ratio of one tenth.

13. The operation perturbance-limited method of waveform-analyzing of claim 1 wherein said operating microwave and millimeter wave frequency integrated circuit electronic device is a MMIC amplifier device operating at a fundamental frequency between four and twenty six gigahertz.

14. The operation perturbance-limited method of waveform-analyzing of claim 1 wherein said transition analysis electronic circuit apparatus comprises a commercially procured transition analyzer instrument having harmonic frequency and phase sensing capability.

* * * * *